(12) United States Patent
Pellizzer et al.

(10) Patent No.: US 6,930,913 B2
(45) Date of Patent: *Aug. 16, 2005

(54) CONTACT STRUCTURE, PHASE CHANGE MEMORY CELL, AND MANUFACTURING METHOD THEREOF WITH ELIMINATION OF DOUBLE CONTACTS

(75) Inventors: Fabio Pellizzer, Follina (IT); Agostino Pirovano, Corbetta (IT)

(73) Assignees: STMicroelectronics S.r.l., Agrate Brianza (IT); Ovonyx Inc., Boise, ID (US)

(*) Notice: Subject to any disclaimer, the term of this patent is extended or adjusted under 35 U.S.C. 154(b) by 124 days.

This patent is subject to a terminal disclaimer.

(21) Appl. No.: 10/372,639

(22) Filed: Feb. 20, 2003

(65) Prior Publication Data

US 2003/0214856 A1 Nov. 20, 2003

Related U.S. Application Data

(63) Continuation-in-part of application No. 10/313,991, filed on Dec. 5, 2002.

(30) Foreign Application Priority Data

Feb. 20, 2002 (EP) .......................................... 02425089

(51) Int. Cl.[7] ........................................... G11C 11/00
(52) U.S. Cl. ...................................... 365/163; 365/148
(58) Field of Search ................................ 365/163, 148

(56) References Cited

U.S. PATENT DOCUMENTS

| | | | |
|---|---|---|---|
| 5,789,277 A | 8/1998 | Zahorik et al. | 438/95 |
| 5,814,527 A | 9/1998 | Wolstenholme et al. | 438/5 |
| 5,952,671 A | 9/1999 | Reinberg et al. | 257/3 |
| 5,970,336 A | 10/1999 | Wolstenholme et al. | 438/238 |
| 6,031,287 A | 2/2000 | Harshfield | 257/734 |
| 6,512,241 B1 * | 1/2003 | Lai | 257/4 |
| 6,613,604 B2 * | 9/2003 | Maimon et al. | 438/95 |
| 6,750,079 B2 * | 6/2004 | Lowrey et al. | 438/95 |
| 2001/0002046 A1 | 5/2001 | Reinberg et al. | 257/3 |
| 2002/0017701 A1 | 2/2002 | Klersy et al. | 257/536 |
| 2003/0075778 A1 * | 4/2003 | Klersy | 257/536 |
| 2003/0219924 A1 * | 11/2003 | Bez et al. | 438/102 |
| 2003/0231530 A1 * | 12/2003 | Bez et al. | 365/200 |
| 2004/0012009 A1 * | 1/2004 | Casagrande et al. | 257/4 |

FOREIGN PATENT DOCUMENTS

| | | |
|---|---|---|
| WO | WO 00/57498 | 9/2000 |
| WO | WO 02/09206 A1 | 1/2002 |

* cited by examiner

*Primary Examiner*—Vu A. Le
(74) *Attorney, Agent, or Firm*—Lisa K. Jorgenson; Robert Iannucci; Seed IP Law Group PLLC

(57) ABSTRACT

The phase change memory cell is formed by a resistive element and by a memory region of a phase change material. The resistive element has a first thin portion having a first sublithographic dimension in a first direction; and the memory region has a second thin portion having a second sublithographic dimension in a second direction which is transverse to said first direction. The first and second thin portions are in direct electrical contact and define a contact area having sublithographic extent. The second thin portion is formed in a slit of sublithographic dimensions. According to a first solution, oxide spacer portions are formed in a lithographic opening, delimited by a mold layer. According to a different solution, a sacrificial region is formed on top of a mold layer and is used for forming the sublithographic slit in the mold layer.

20 Claims, 13 Drawing Sheets

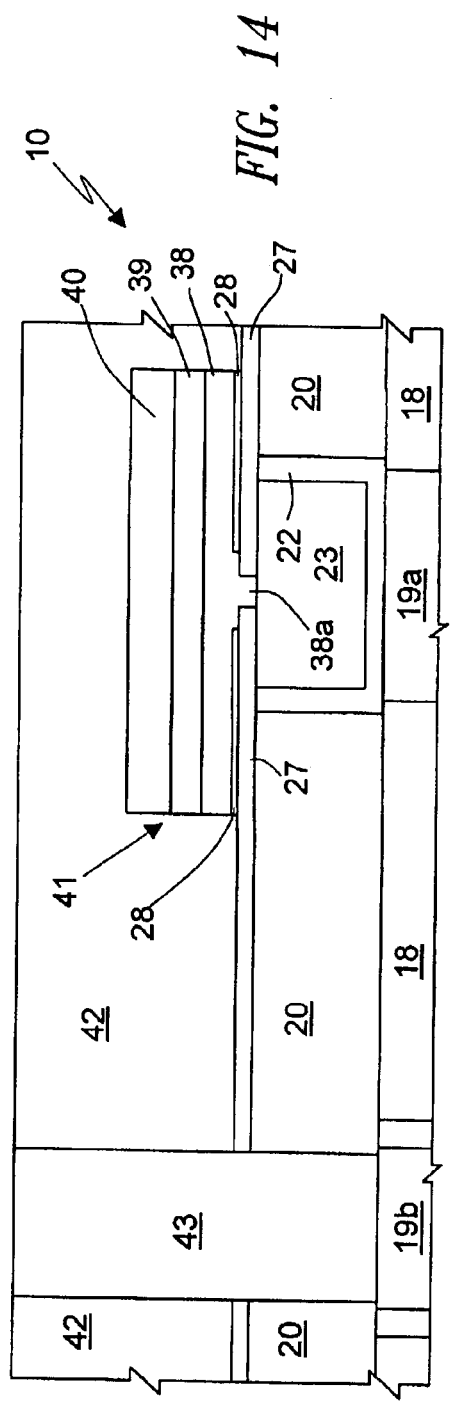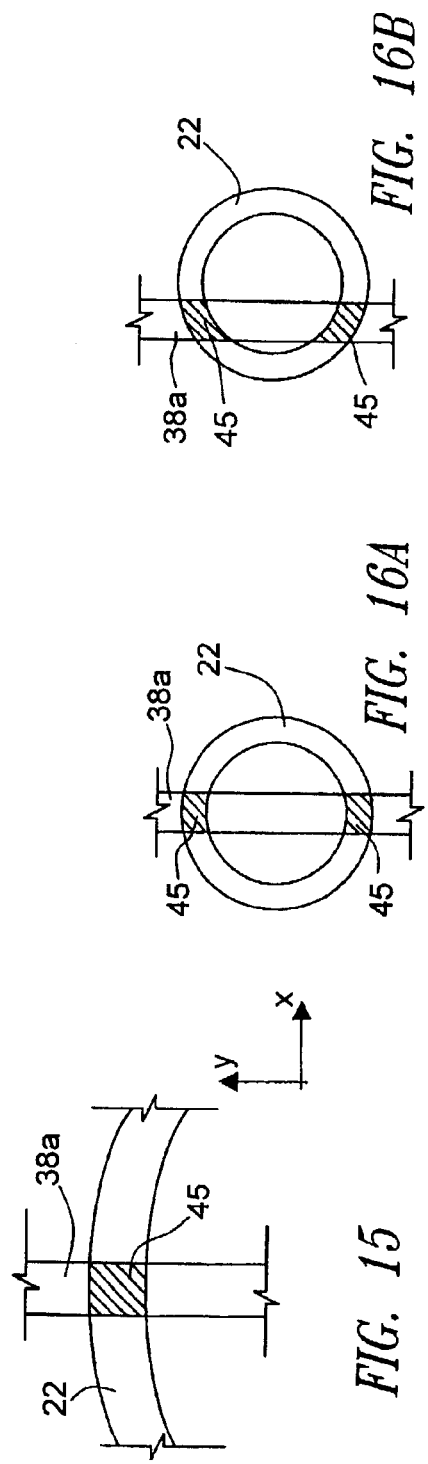

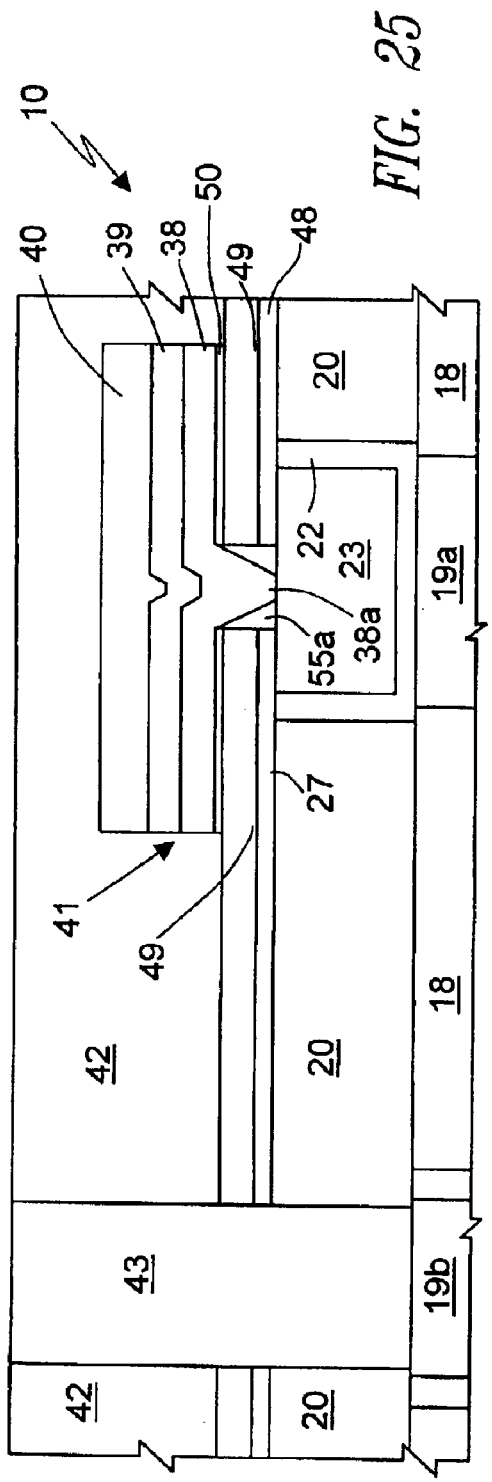
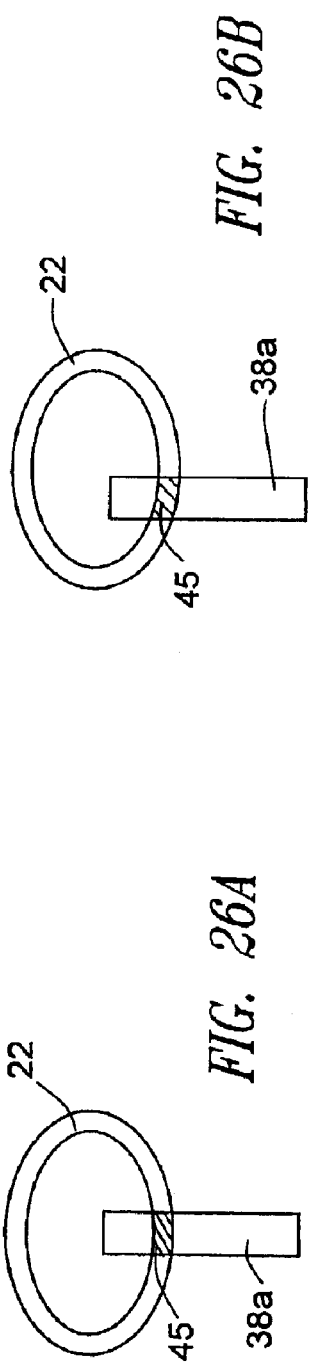

CONTACT STRUCTURE, PHASE CHANGE MEMORY CELL, AND MANUFACTURING METHOD THEREOF WITH ELIMINATION OF DOUBLE CONTACTS

CROSS-REFERENCE TO RELATED APPLICATION

This application is a continuation-in-part of U.S. patent application Ser. No. 10/313,991, filed Dec. 5, 2002, now pending, which application is incorporated herein by reference in its entirety.

BACKGROUND OF THE INVENTION

1. Field of the Invention

The present invention relates to a contact structure, a phase change memory cell, and a manufacturing process thereof.

2. Description of the Related Art

As is known, phase change memory (PCM) elements exploit the characteristics of materials which have the property of changing between two phases having distinct electrical characteristics. For example, these materials may change from an amorphous phase, which is disorderly, to a crystalline or polycrystalline phase, which is orderly, and the two phases are associated to considerably different resistivity.

At present, alloys of group VI of the periodic table, such as Te or Se, referred to as chalcogenides or chalcogenic materials, can advantageously be used in phase change cells. The chalcogenide that currently offers the most promise is formed by a Ge, Sb and Te alloy ($Ge_2Sb_2Te_5$), which is currently widely used for storing information in overwritable disks.

In chalcogenides, the resistivity varies by two or more magnitude orders when the material passes from the amorphous phase (more resistive) to the polycrystalline phase (more conductive) and vice versa. The characteristics of chalcogenides in the two phases are shown in FIG. 1. As may be noted, at a given read voltage, here designated by Vr, there is a resistance variation of more than 10.

Phase change may be obtained by locally increasing the temperature, as shown in FIG. 2. Below 150° C. both phases are stable. Above 200° C. (temperature of start of nucleation, designated by $T_x$), fast nucleation of the crystallites takes place, and, if the material is kept at the crystallization temperature for a sufficient length of time (time $t_2$), it changes its phase and becomes crystalline. To bring the chalcogenide back into the amorphous state, it is necessary to raise the temperature above the melting temperature $T_m$ (approximately 600° C.) and then to cool the chalcogenide off rapidly (time $t_1$).

From the electrical standpoint, it is possible to reach both critical temperatures, namely the crystallization temperature and the melting point, by causing a current to flow through a resistive element which heats the chalcogenic material by the Joule effect.

The basic structure of a PCM element 1 which operates according to the principles described above is shown in FIG. 3 and comprises a resistive element 2 (heater) and a programmable element 3. The programmable element 3 is made of a chalcogenide and is normally in the polycrystalline state in order to enable a good flow of current. One part of the programmable element 3 is in direct contact with the resistive element 2 and forms the area affected by phase change, hereinafter referred to as the phase change portion 4.

If an electric current having an appropriate value is caused to pass through the resistive element 2, it is possible to heat the phase change portion 4 selectively up to the crystallization temperature or to the melting temperature and to cause phase change. In particular, if a current I flows through a resistive element 2 having resistance R, the heat generated is equal to $I^2R$.

The use of the PCM element of FIG. 3 for forming memory cells has already been proposed. In order to prevent noise caused by adjacent memory cells, the PCM element is generally associated to a selection element, such a MOS transistor, a bipolar transistor, or a diode.

All the known approaches are, however, disadvantageous due to the difficulty in finding solutions that meet present requirements as regards capacity for withstanding the operating currents and voltages, as well as functionality and compatibility with present CMOS technologies.

In particular, considerations of a technological and electrical nature impose the creation of a contact area of small dimensions, preferably 20 nm×20 nm, between the chalcogenic region and a resistive element. However, these dimensions are much smaller than those that can be obtained with current optical (UV) lithographic techniques, which scarcely reach 100 linear nm.

BRIEF SUMMARY OF THE INVENTION

An embodiment of the invention provides a contact structure in a semiconductor electronic device. The contact structure includes a first conductive region and a second conductive region of a phase change material which extends on top of said first conductive region. The first conductive region has a closed-shape wall including a first thin portion having a first sublithographic dimension in a first direction. The second conductive region has a second thin portion having a second sublithographic dimension in a second direction transverse to the first dimension. The second thin portion crosses, and is in direct electrical contact with, the first conductive region only at the first thin portion so as to form a single contact area having a sublithographic extension.

Another embodiment provides phase-change memory cell having a resistive element and a memory region made of a phase-change material, which extends on top of said resistive element. The resistive element has a wall having a closed shape including a first thin portion having a first sublithographic dimension in a first direction. The memory region has a second thin portion having a second sublithographic dimension in a second direction transverse to the first dimension. The second thin portion crosses, and is in direct electrical contact with, the first resistive element only at the first thin portion so as to form a single contact area having a sublithographic extension.

Another embodiment provides a memory array having two memory cells adjacent to one another in a first direction. Each of the memory cells has a respective resistive element including a first thin portion having a first sublithographic dimension in the first direction. The two memory cells further include a common memory region of a phase change material extending above the resistive element and including a second thin portion having a second sublithographic dimension in a second direction transverse to the first dimension. Each resistive element crosses, and is in direct electrical contact with, the second thin region only at a point of the first thin portion so as to form a respective single contact area having a sublithographic extension.

Other embodiments provide a process for manufacturing a semiconductor electronic device having a contact area as described above, a process for manufacturing a phase change memory cell as described above, and a process for manufacturing a memory array as described above.

BRIEF DESCRIPTION OF THE SEVERAL VIEWS OF THE DRAWING(S)

For a better understanding of the present invention, a preferred embodiment thereof is now described, purely by way of non-limiting example, with reference to the attached drawings, wherein:

FIGS. 7–14 are cross-section of the structure of the parent patent application, in successive manufacture steps;

FIG. 15 is a top plan view, with parts removed and at an enlarged scale, of a detail of FIG. 4;

FIGS. 16a and 16b are top plan views, with parts removed, of a detail of FIG. 14, in two different manufacture conditions;

FIG. 25 is a cross-section, similar to FIG. 14, in a final manufacture step according to an embodiment of the invention;

FIGS. 26a and 26b are top plan views of the contact area, in two different manufacture conditions;

DETAILED DESCRIPTION OF THE INVENTION

The parent application teaches forming the contact area as an intersection of two thin portions extending transversely with respect to one another and each of a sublithographic size. In order to form the thin portions, deposition of layers is adopted instead of a lithographic process, given that deposition makes it possible to obtain very thin layers, i.e., having a thickness much smaller than the current minimum size that can be achieved using lithographic techniques.

For a better understanding of the problem of the present invention, the manufacturing process object of the parent patent application will now be described.

Figure 4:
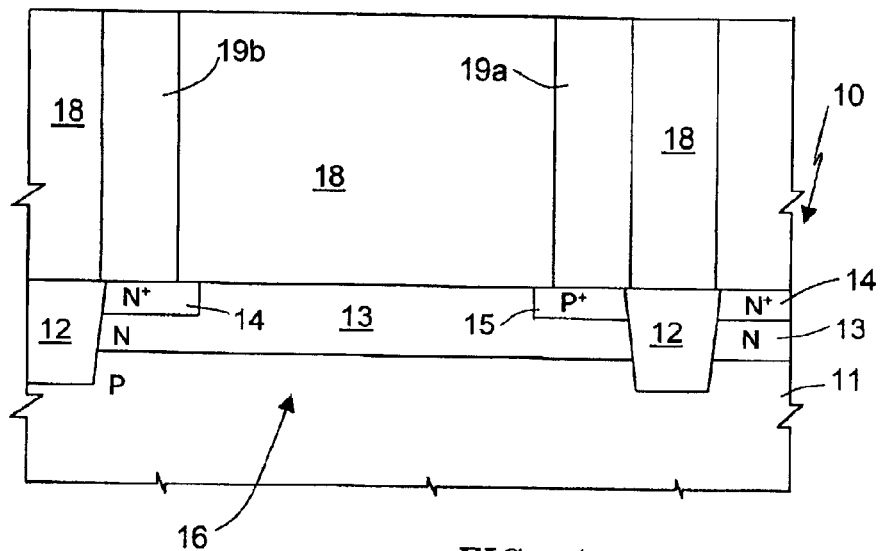
FIG. 4 shows a cross section of a wafer of semiconductor material in a manufacturing step of the cell of FIG. 3, according to the parent patent application.

With reference to FIG. 4, initially a wafer 10 comprising a P-type substrate 11 is subjected to standard front end steps. In particular, inside the substrate 11 insulation regions 12 are formed and delimit active areas 16; then, in succession, N-type base regions 13, $N^+$-type base contact regions 14, and $P^+$-type emitter regions 15 are implanted. The base regions 13, base contact regions 14, and emitter regions 15 form diodes that form selection elements for the memory cells.

Next, a first dielectric layer 18 is deposited and planarized; openings are formed in the first dielectric layer 18 above the base contact regions 13 and emitter regions 15, and the openings are filled with tungsten to form base contacts 19b and emitter contacts 19a. The base contacts 19b are thus in direct electrical contact with the base contact regions 13, and the emitter contacts 19a are in direct electrical contact with the emitter regions 15. Advantageously, the openings in the first dielectric layer 18 can be covered by a barrier layer, for example a Ti/TiN layer, before being filled with tungsten. In this way, the structure of FIG. 4 is obtained.

Figure 5:
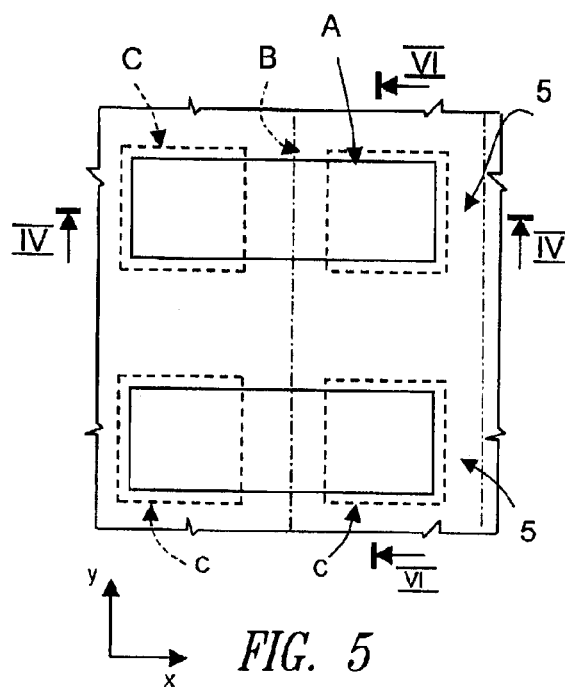
FIG. 5 shows the layout of some masks used for forming the structure of FIG. 4.
Figure 6:
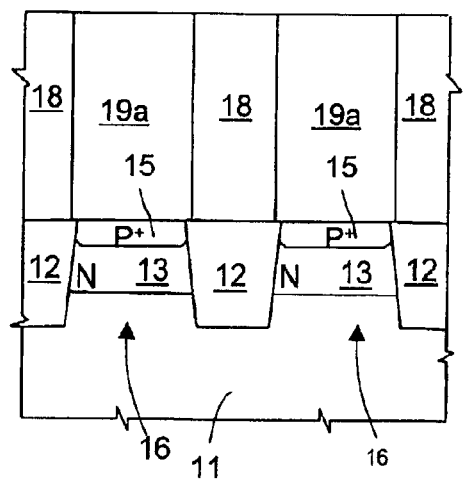
FIG. 6 is a cross-section taken along line VI—VI of FIG. 5.

FIG. 5 shows the layout of some masks used for forming the structure of FIG. 4 regarding a pair of memory cells 5 that are adjacent in a perpendicular direction to the sectional plane of FIG. 4 (Y direction). In particular, the figure shows a mask A used for defining the active areas 16, a mask B used for implanting the emitter regions 15, and a mask C for forming the openings where the base contacts 19b and the emitter contacts 19a are to be formed. FIG. 4 is a cross-section taken along line IV—IV of FIG. 5, while FIG. 6 shows the same structure sectioned along the section line VI—VI of FIG. 5.

Figure 1:
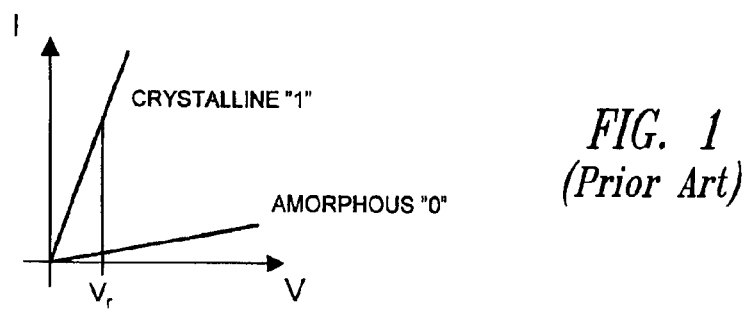
FIG. 1 shows the current versus voltage characteristic of a phase change material.
Figure 2:
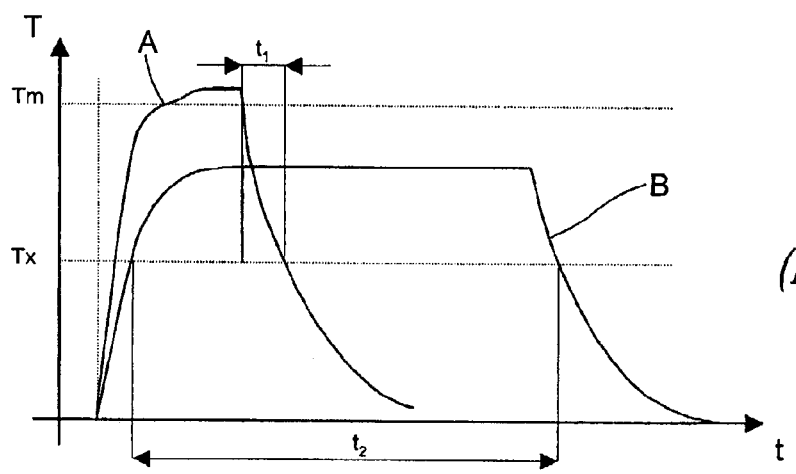
FIG. 2 shows the temperature versus current plot of a phase change material.
Figure 3:
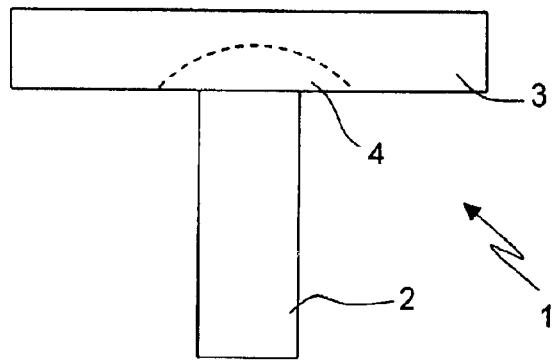
FIG. 3 shows the basic structure of a PCM memory element.

Next (FIG. 7), a second dielectric layer 20—for example, an undoped silicon glass (USG) layer—is deposited, and openings 21 are formed in the second dielectric layer 20 above the emitter contact 19a. The openings 21 have dimensions dictated by the lithographic process and are, for example, circle shaped. Next, a heating layer, for example of TiSiN, TiAlN or TiSiC, is deposited for a thickness of 10–50 nm, preferably 20 nm. The heating layer, designed to form the resistive element 2 of FIG. 3, conformally coats the walls and bottom of the openings 21 and is subsequently removed outside the openings 21. The remaining portions of the heating layer thus form a cup-shaped region 22 and are then filled with dielectric material 23.

Figure 8:
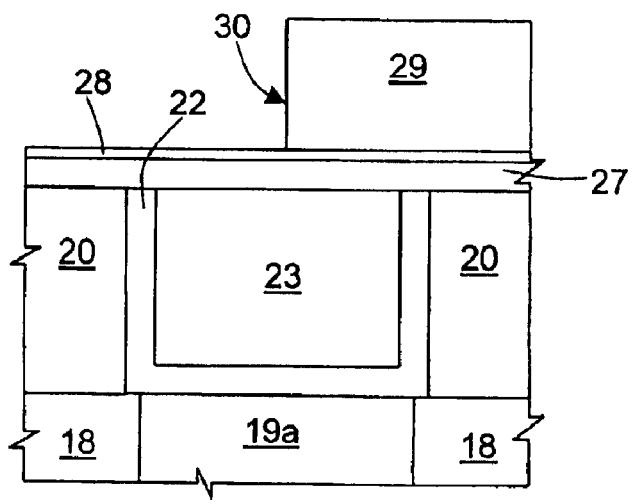

Next, as shown in the enlarged detail of FIG. 8, a mold layer 27, for instance USG having a thickness of 20 nm, an adhesion layer 28, for instance Ti or Si with a thickness of 5 nm, and a first delimiting layer 29, for example nitride or another material that enables selective etching with respect to the adhesion layer 28, are deposited in sequence. The first delimiting layer 29 has a thickness of, for instance, 150 nm. Then, using a mask, one part of the first delimiting layer 29 is removed by dry etching to form a step which has a vertical side 30 that extends vertically on top of the dielectric material 23. The structure shown in FIG. 8 is thus obtained.

Figure 9:
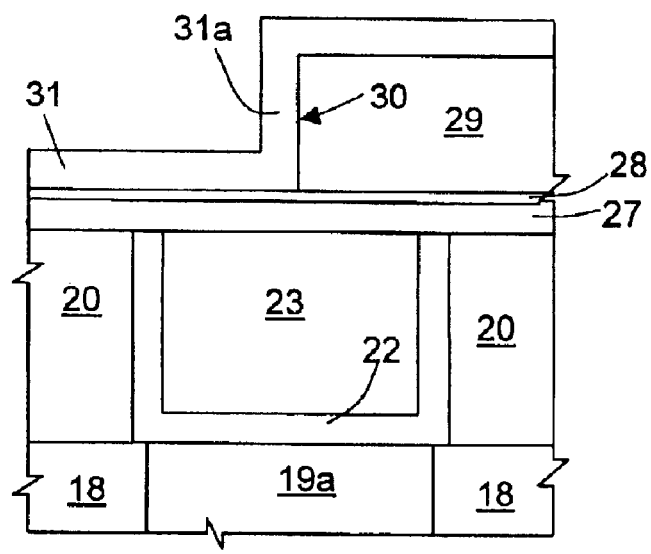

Next (FIG. 9), a sacrificial layer 31, for example TiN with a thickness of 30 nm, is deposited conformally. In particular, the sacrificial layer forms a vertical wall 31a that extends along the vertical side 30 of the first delimiting layer 29.

Figure 10:
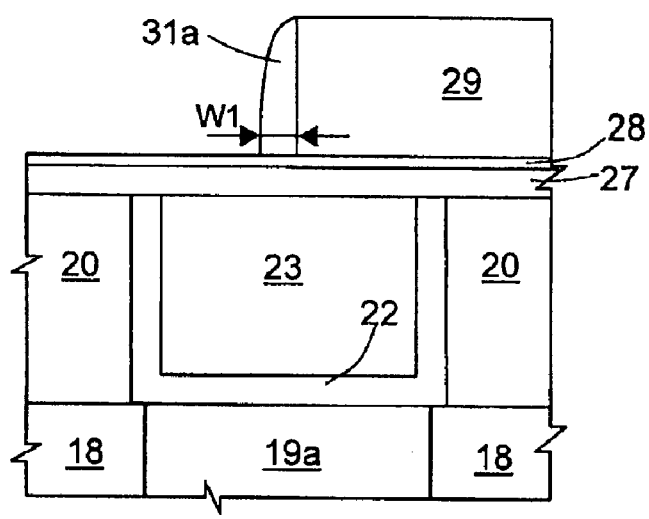

Next (FIG. 10), the sacrificial layer 31 is undergoes an etch back that results in removal of the horizontal portions of the sacrificial layer 31 and of part of the vertical wall 31 a. By appropriately choosing the thickness of the first delimiting layer 29 and the thickness of the sacrificial layer 31, as well as the time and type of etching, it is possible to obtain the desired sublithographic width W1 for the bottom part of the remaining vertical wall 31a.

Figure 11:
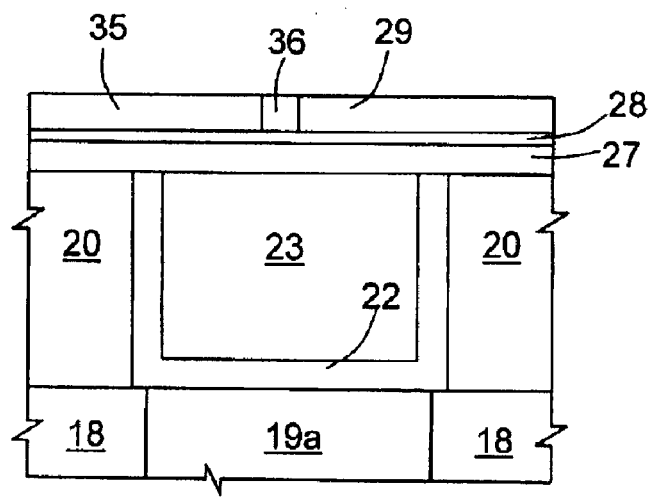

As shown in FIG. 11, a second delimiting layer 35, of the same material as the first delimiting layer 29, for example nitride, with a thickness of 300 nm, is deposited. Next, the delimiting layers 29, 35 and the vertical wall 31a are thinned by Chemical Mechanical Polishing (CMP). At the end, the remaining portions of the delimiting layers 29, 35 form a hard mask, and the remaining portion of the vertical wall forms a sacrificial region 36.

Figure 12:
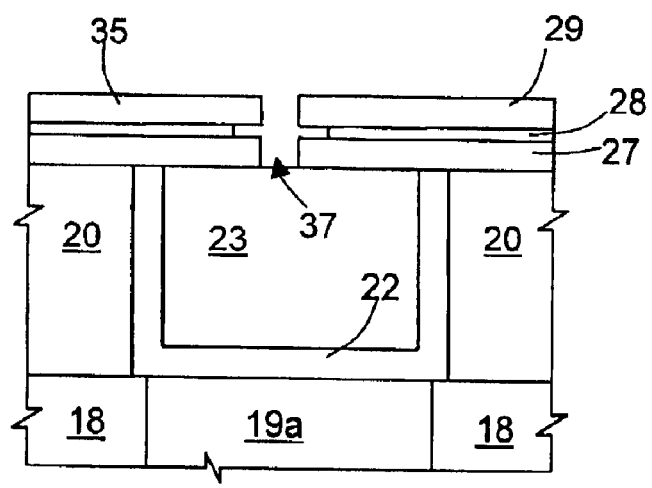

Next (FIG. 12), the sacrificial region 36 is removed. The adhesion layer 28 is isotropically etched, and the mold layer 27 is dry etched to form a slit 37 in the mold layer 27, the slit 37 having a width W1 equal to the width of the sacrificial region 36.

Figure 13:
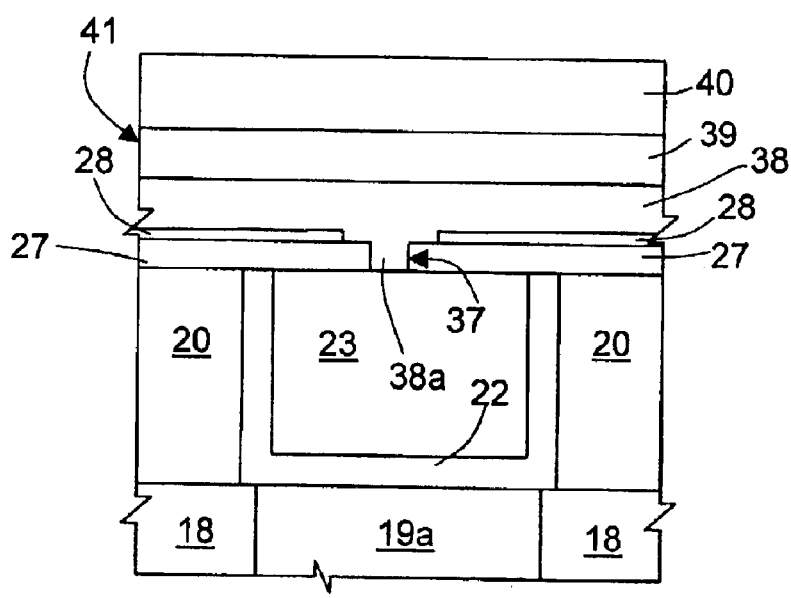

Next (FIG. 13), the delimiting layers 29, 35 are removed, and a chalcogenic layer 38, for example of $Ge_2Sb_2Te_5$ with a thickness of 60 nm, is deposited conformally. The portion 38a of the chalcogenic layer 38 fills the slit 37 and forms, at the intersection with the cup-shaped region 22, a phase change region similar to the phase change portion 4 of FIG. 3. Then, on top of the chalcogenic layer 38 a barrier layer 39, for example of Ti/TiN, and a metal layer 40, for example of AlCu, are deposited. The structure of FIG. 13 is thus obtained.

Next (FIG. 14), the stack formed by the metal layer 40, barrier layer 39, chalcogenic layer 38, and adhesion layer 28 is defined using a same mask to form a bit line 41. Finally, a third dielectric layer 42 is deposited, which is opened above the base contacts 19b. The openings thus formed are filled with tungsten to form top contacts 43 in order to prolong upwards the base contacts 19b. Then standard steps are performed for forming the connection lines for connection to the base contacts 19b and to the bits lines 41, and the final structure of FIG. 14 is thus obtained.

In practice, as shown in FIG. 15, the intersection between the cup-shaped region 22 and the thin portion 38a of the chalcogenic layer 38 forms a contact area 45 which is approximately square and has sublithographic dimensions. This is due to the fact that both the cup-shaped region 22 and the thin portion 38a have a width equal to the thickness of a deposited layer. In fact, the width of the cup-shaped region 22 is given by the thickness of the heating layer, and the width of the thin portions 38a is determined by the thickness of the sacrificial layer 31 along the vertical side 30. In greater detail, in the proximity of the contact area 45, the cup-shaped region 22 has a sublithographic dimension in a first direction (Y direction), and the thin portion 38a has a sublithographic dimension (width W1 of FIG. 10) in a second direction (X direction) which is transverse to the first direction. Hereinafter, the term "sublithographic dimension" means a linear dimension smaller than the limit dimension achievable with current optical (UV) lithographic techniques, and hence smaller than 100 nm, preferably 50–60 nm, down to approximately 20 nm.

In the process described above, forming the thin portion 38a of the chalcogenic layer 38 entails numerous steps and is somewhat complex. Consequently, it is desirable to avail a simpler alternative process.

In addition, the dimensions of the contact area 45 depend upon the alignment tolerances between the mask used for forming the openings 21 and the mask used for removing part of the first delimiting layer 29 and for forming the vertical side 30 (FIG. 8). In fact, as emerges clearly from a comparison between FIGS. 16a and 16b which are top plan views of the contact area 45, in the case of a cup-like region 22 having a circular shape and a diameter of approximately 0.2 μm, an alignment error of even only 0.05 μm between the two masks results in the thin portions 38a no longer crossing the cup-shaped regions 22 perpendicularly, with a consequent considerable increase in the dimensions of the contact area 45 (see FIG. 16b) and hence a considerable increase in the flowing current, the value whereof would be uncontrollable.

Furthermore, the thin portion 38a crosses each cup-shaped region 22 in two points, thus doubling the total contact area between the thin portions 38a and the cup-shaped regions 22, and consequently also increasing the programming current. In the case of a marked misalignment between the two above masks, just one contact area is even obtained which has dimensions far greater than the requirements. The presence of a double contact gives rise to functional problems, given that in this situation it would be impossible to know which of the two contact areas 45 first causes switching of the overlying thin portion 38a (i.e., the phase change portion), nor would it be possible to be certain that both of the thin portions 38a overlying the two contact areas will switch.

In the following description, parts that are the same as those previously described with reference to FIGS. 4–14 are designated by the same reference numbers.

Figure 7:
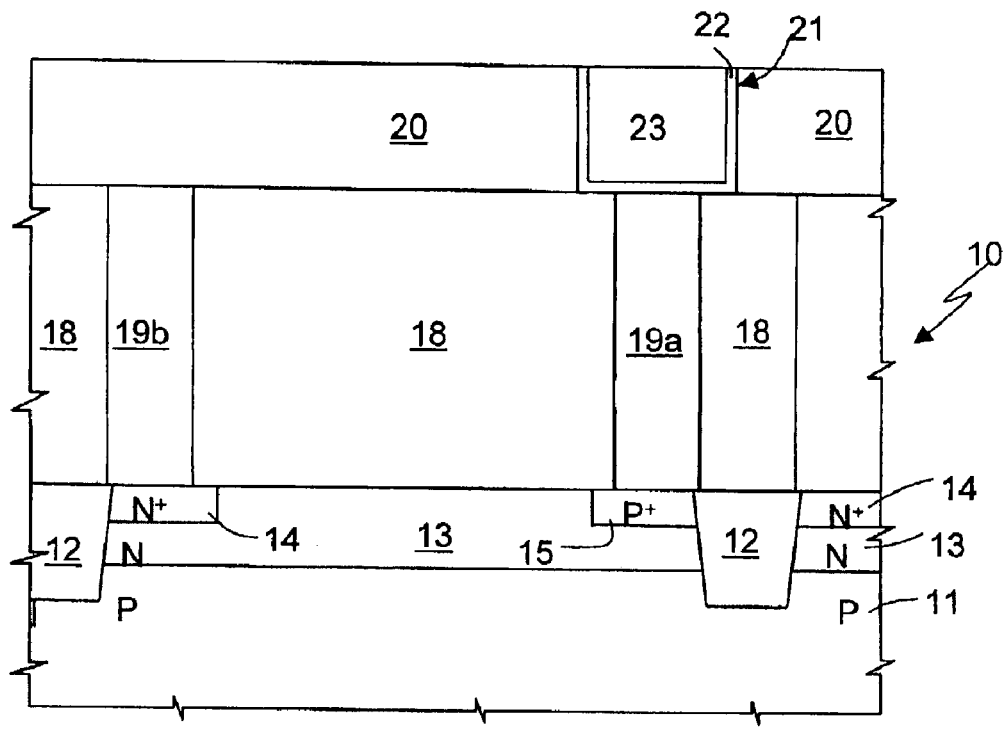
Figure 17:
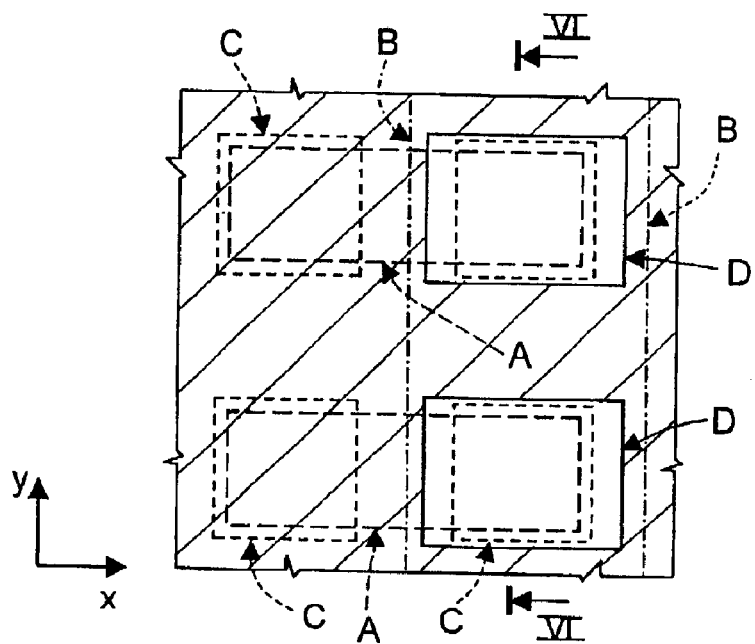
FIG. 17 shows the layout of some masks used for forming the structure of FIG. 7, according to a first embodiment of the invention.
Figure 22:
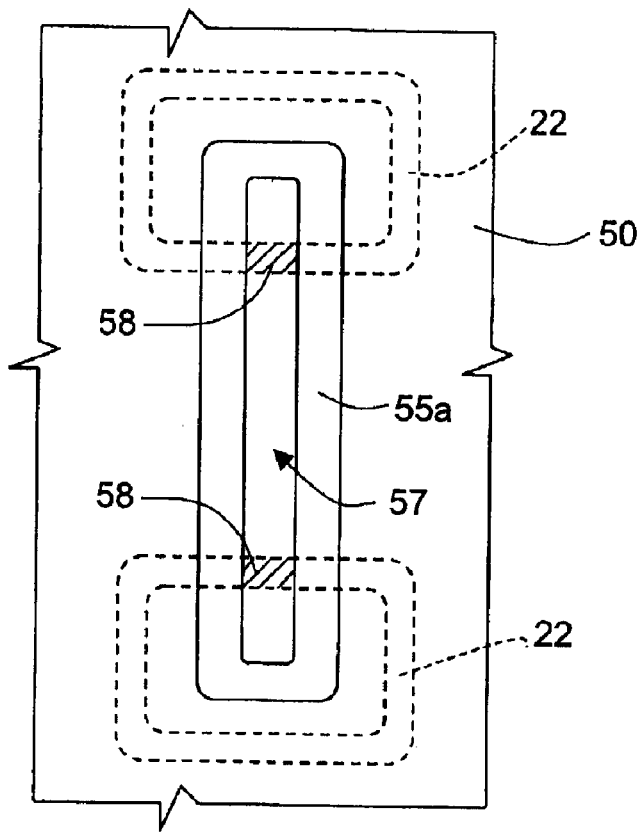
FIG. 22 is a top plan view of the structure of FIG. 21.

The process according to an embodiment of the present invention comprises initial steps equal to those described in the parent patent application illustrated above, up to deposition of the second dielectric layer 20 (FIG. 7). Next, also here the openings 21 and the cup-shaped regions 22 are formed. However, as shown in FIG. 17, for the definition of the openings 21, a heater mask D is used which has rectangular windows (the term "rectangular" also comprising the particular case of a square shape). Consequently, the openings 21 have a substantially rectangular shape. Then the heating layer, for example of TiSiN, TiAlN or TiSiC, with a thickness of 10–50 nm, preferably 20 nm, is deposited. The heating layer coats the walls and bottom of the openings 21 conformally. Consequently, in top plan view, the cup-like regions 22 here define an ideally rectangular shape, possibly with rounded edges (on account of the lithographic limits), or at the most an ovalized shape, with the longer side, or main direction, parallel to the X direction (FIG. 22). Next, the heating layer is removed outside the openings 21 to form the cup-shaped regions 22, which are then filled with the dielectric material 23.

Figure 18:
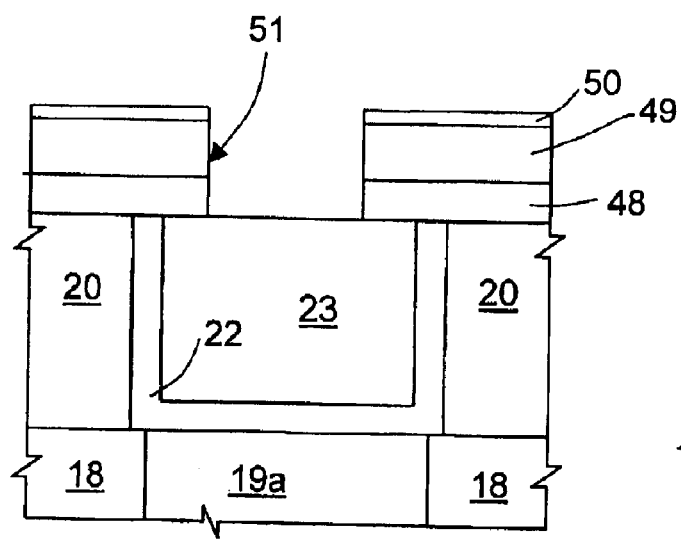
FIG. 18 is a cross-section of the structure, analogous to FIG. 8, in a fabrication step according to the first embodiment.

Then (FIG. 18), a stop layer 48, for example of nitride deposited by PECVD (Plasma Enhanced Chemical Vapor Deposition) with a thickness of 40 nm, a mold layer 49, for example of USG deposited by PECVD or SACVD (Sub-Atmospheric Chemical Vapor Deposition) with a thickness of 50–70 nm, and an adhesion layer 50, for example of Ti or Si with a thickness of 20–40 nm, are deposited in sequence.

Figure 19:
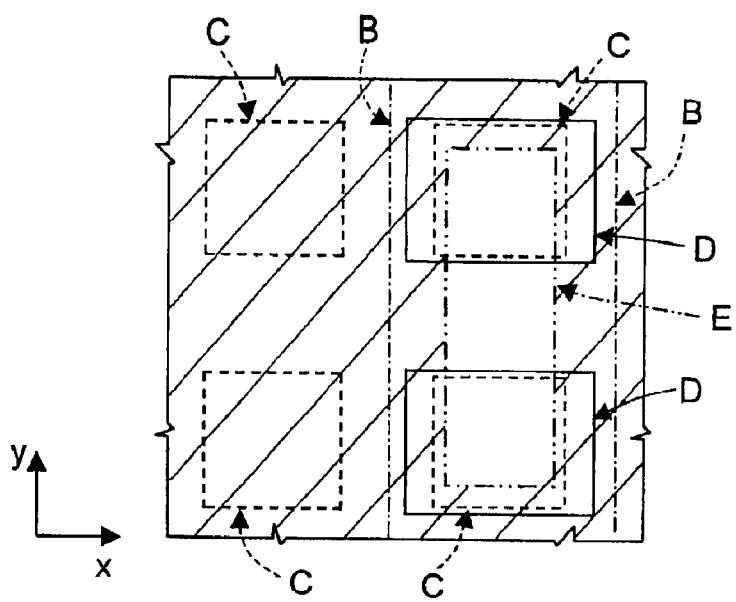
FIG. 19 shows the layout of some masks used for forming the structure of FIG. 18.

Next, using a minitrench mask, designated by E in FIG. 19, the adhesion layer 50, the mold layer 49 and the stop layer 48 are etched. As shown in FIG. 19, the minitrench mask E has a rectangular window that extends between two adjacent cells 5 in the Y direction (perpendicular to the alignment direction of the base and emitter regions 14, 15 of each memory cell 5, FIG. 7).

Following upon etching, part of the layers 48, 49 and 50 is removed, so as to form an opening 51 having a rectangular shape, corresponding to that of the minitrench mask E. The width of the opening 51 in the X direction is, for example, 160 nm. The opening 51 uncovers part of the dielectric material 23 of the two adjacent cells 5 and crosses each cup-shaped region 22 only once, as can be clearly seen from the superposition of the heater mask D and minitrench mask E in FIG. 19.

Figure 20:
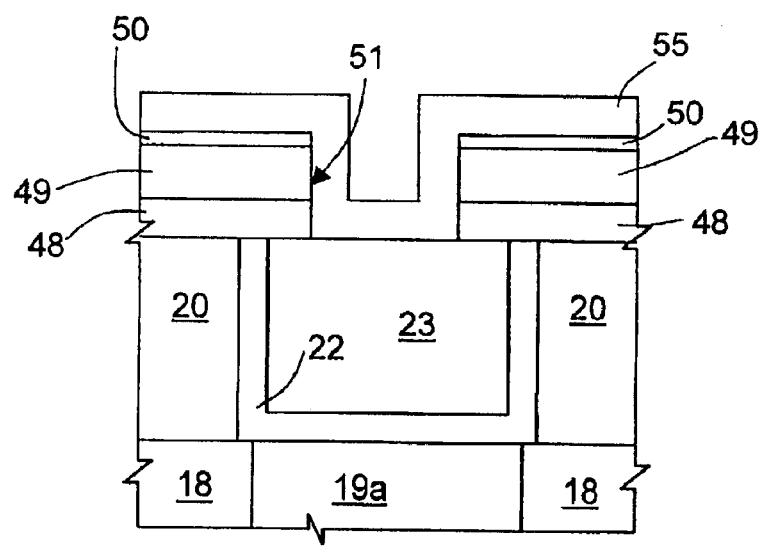
FIGS. 20 and 21 are cross-sections, similar to FIG. 18, in successive manufacture steps according to an embodiment of the invention.

Next, FIG. 20, a spacer layer 55, for example an oxide layer, is deposited (in particular, TEOS with a thickness of 50 nm). The spacer layer 55 covers the adhesion layer 50, as well as the walls and bottom of the opening 51.

Figure 21:
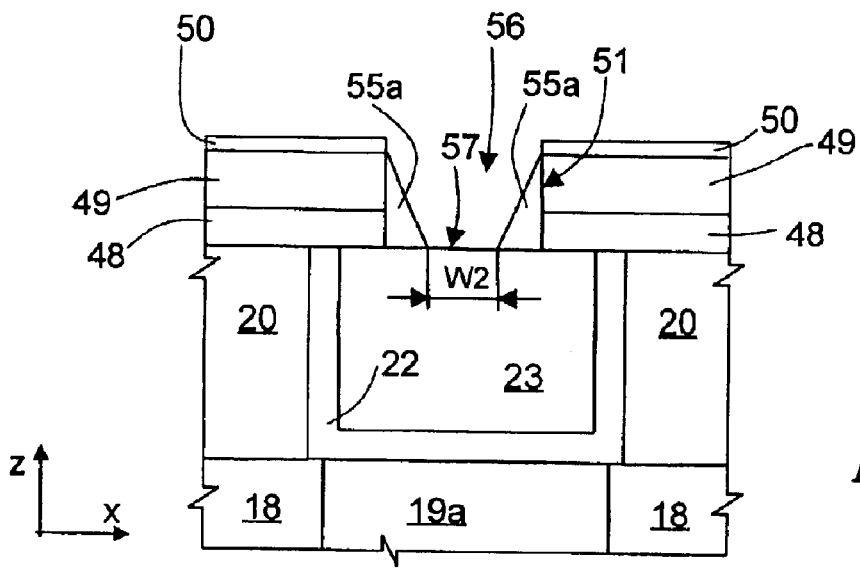

Then, FIG. 21, the spacer layer 55 is anisotropically etched back until the horizontal portions thereof are removed, according to the well known spacer formation technique. The spacer layer 55 is then completely removed above the adhesion layer 50 and is partially removed from the bottom of the opening 51 to form a spacer region 55a which extends along the vertical sides of the opening 51 (along the perimeter of a rectangle or of an oval) and delimits a slit 56, the base whereof forms a rectangular strip 57 having a sublithographic width W2 (in the X direction) of approximately 60 nm. FIG. 22 is a top plan view of the structure thus obtained, and highlights how the strip 57 uncovers only one portion of the cup-shaped region 22 of each cell 5, shown with dashed line in the figure. The uncovered portion of each cup-shaped region 22 forms a contact area 58, as will be explained hereinafter.

Figure 23:
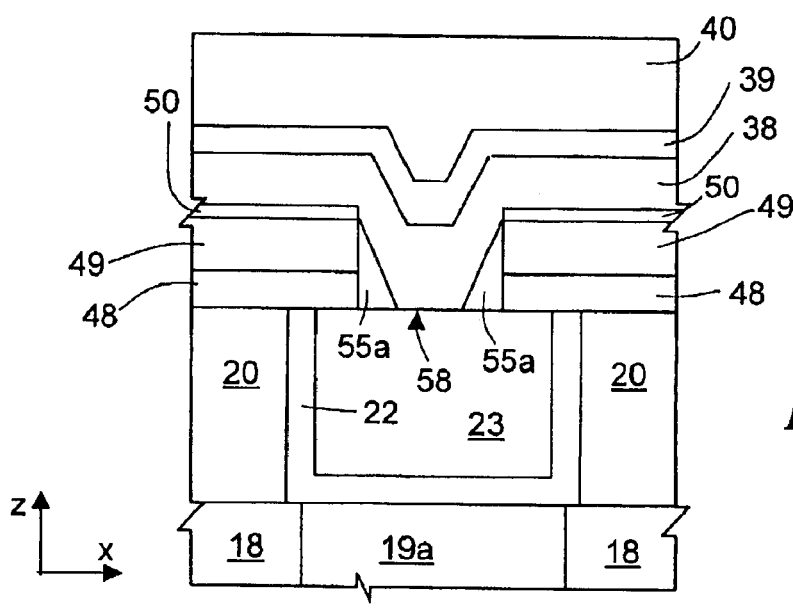
FIG. 23 is a cross-section, similar to FIG. 21, in a subsequent manufacture step.

Next, FIG. 23, the chalcogenic layer 38 (also in the present case, for instance, of $Ge_2Sb_2Te_5$ with a thickness of 60 nm), the barrier layer 39, and the metal layer 40 are deposited in succession, to form a stack of layers 41. The chalcogenic layer 38 is in direct contact with the adhesion layer 50, to which it adheres properly, and fills the slit 56 with a thin portion 38a. In particular, the thin portion 38a of the chalcogenic layer 38 deposits on the strip 57, contacting the cup-shaped regions 22 at the contact areas 58. The inclined wall formed by the spacer region 55a favors filling of the slit 56, so preventing problems linked to a poor aspect ratio of the opening 51.

Figure 24:
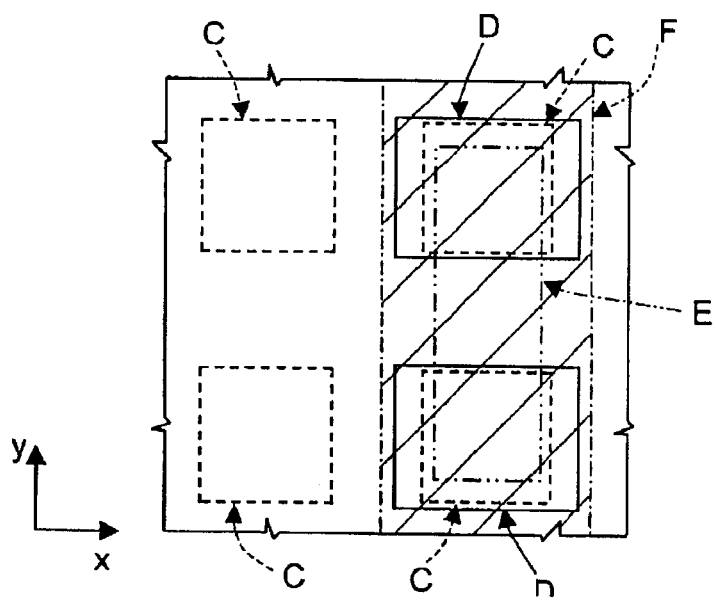
FIG. 24 shows the layout of same masks used for forming the structure of FIG. 23.

Next, the stack of layers 41 is defined using a stack mask F (FIG. 24).

The process continues with the steps described previously, which comprise deposition of the third dielectric layer 42, opening of the third dielectric layer 42 above the base contacts 19b, formation of the top contacts 43, and formation of connection lines for connection to the base contacts 19b and to the bit lines 41, so as to obtain the final structure shown in FIG. 25.

According to a different embodiment, the thin portion 38a of the chalcogenic layer 38 is formed using the technology described in the parent patent application, and the second crossing-over between the cup-shaped region 22 and the thin portion 38a is avoided by using a special mask referred to as "rapier-selection mask", as described hereinafter.

In detail, the process comprises initial steps that are the same as those described with reference to FIGS. 4–9, with the sole difference that the cup-shaped region 22 is preferably formed using the mask of FIG. 17 so as to obtain a rectangular shape or at the most an oval shape on account of the lithographic limits. At this point, the vertical wall 31a is present on the step 30 of the first delimitation layer 29, and the rest of the sacrificial layer 31 has already been removed.

Figure 27:
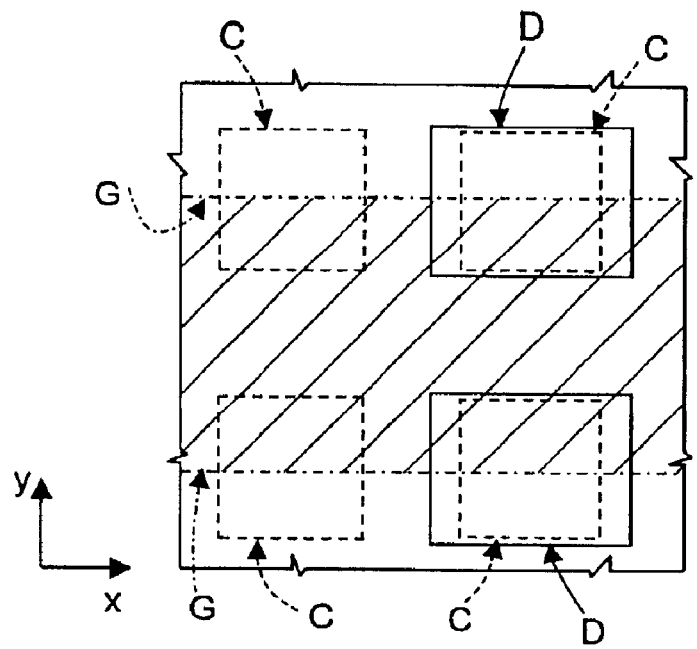
FIG. 27 shows the layout of some masks used after forming the structure of FIG. 10, according to a second embodiment of the invention.

Next, using an appropriate mask referred to as "rapier-selection mask" G, illustrated in FIG. 27, part of the vertical wall 31a is removed so that this wall intersects the cup-shaped region 22 of each shell 5 in just one point. In detail, the rapier-selection mask G covers a strip which extends parallel to the direction X bestriding two cells 5. The portions of the vertical wall 31a not covered by the rapier-selection mask G are then removed. In this way, as illustrated in the top plan view of FIG. 28 regarding two adjacent cells 5, at the side of the step 30 there remains just one portion of vertical wall 31a, the section of which in the X-Z plane coincides with that of FIG. 10 described above. As may be noted, the remaining portion of vertical wall 31a intersects each cup-shaped region 22 just once, as is highlighted by the hatched area which will subsequently come to form the contact area 45.

Figure 28:
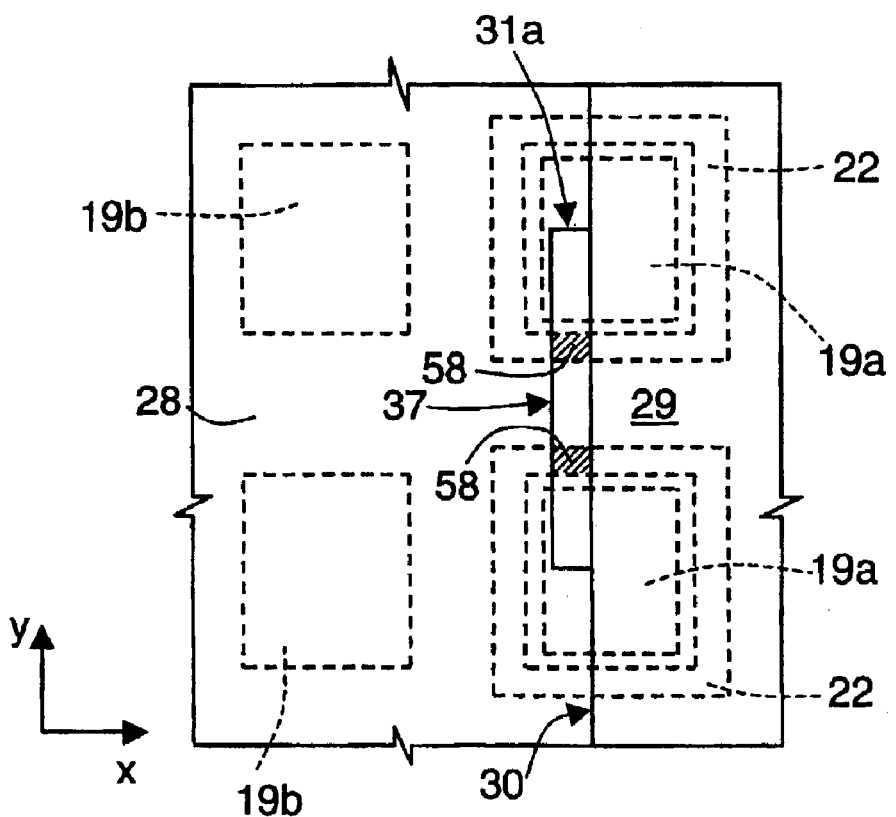
FIG. 28 is a top plan view of the structure obtained with the masks of FIG. 27.

The process goes on with the same steps as those described above with reference to FIGS. 11–14, and then with deposition of the second delimitation layer 35; thinning of the delimitation layers 35 and 29, as well as of the vertical wall 31a until the structure of FIG. 11 is obtained; removal of the sacrificial portion 36 and etching of the adhesion layers 28 and of the mold layer 27 (FIG. 12), thereby the slit 37 has the same area as the vertical wall 31a in FIG. 28; deposition of the chalcogenic layer 38 which fills the slit 37 of the mold layer 27; deposition of the barrier layer 39 and of the metal layer 40; shaping of the stack formed by the metal layer 40, the barrier layer 39, the chalcogenic layer 38 and the adhesion layer 28; deposition of the third dielectric layer 42; and the final steps described above for obtaining the structure illustrated in FIG. 14.

In practice, in both of the embodiments thin portions 38a are formed having a roughly parallelepiped shape and short length, i.e., smaller than the overall dimensions of two cells 5 in the Y direction. In the first embodiment, the thin portion 38a is delimited by the spacer region 55a; in the second embodiment, the thin portion 38a is delimited directly by the mold layer 27.

Figure 29:
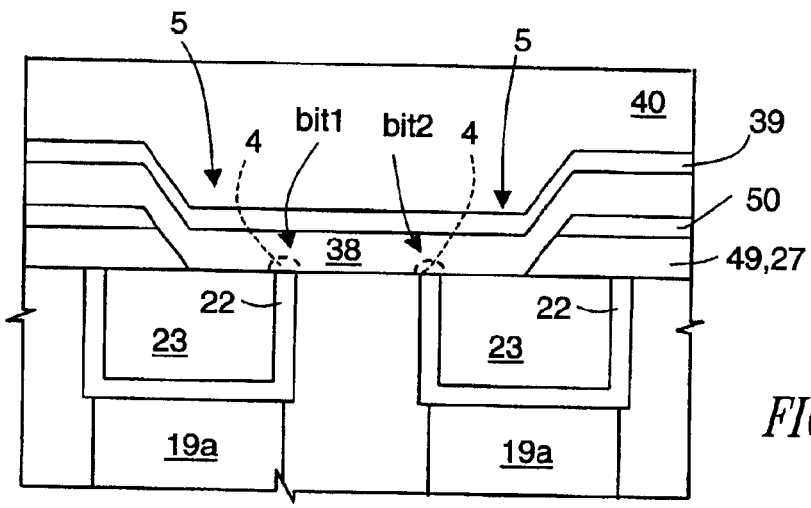
FIG. 29 is a cross-section, perpendicular to that of FIG. 23, for the first embodiment.

In both the embodiments, as visible in FIGS. 22 and 28, it is disadvantageous that the contact areas 58 of two adjacent cells 5 are near and formed by a same portion of the chalcogenic layer 38, as also visible in the cross-section of FIG. 29 for the first embodiment. As said, phase change portions 4 are formed above these contact areas 58 and store respective bits, identified in FIG. 29 as bit1 and bit2. During programming of one of the bits (e.g. bit1), a melting temperature is reached at the respective contact area. This high temperature is a disturb for bit2 and could erase the information stored therein. For example, if the phase change portion 4 storing bit2 is in the amorphous state (high resistance), it may change in the crystalline state. Obviously the disturb is a function of the thermal resistance of the chalcogenide material and the distance between two adjacent bits along the bit line. For example, with present materials and techniques, is has been calculated that the temperature at an adjacent cell may be one tenth of the temperature of a cell to be programmed.

Figure 30:
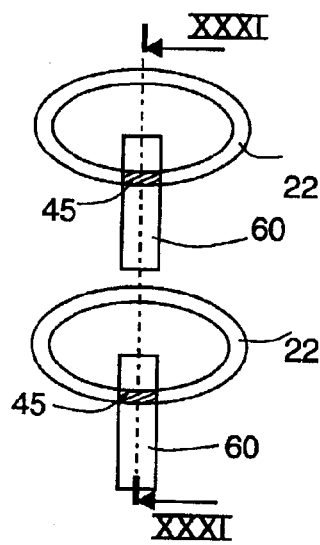
FIG. 30 is a plan view of the contact areas for two adjacent cells, according to a further embodiment.

To solve this drawback, the layout of FIG. 30 is proposed, wherein a slit 60 is formed for each cell 5 before depositing the chalcogenic layer 38 (wherein the slit 60 is obtained either with the first embodiment described with reference to FIGS. 17–25 or with the second embodiment according to FIGS. 27–28).

Figure 31:
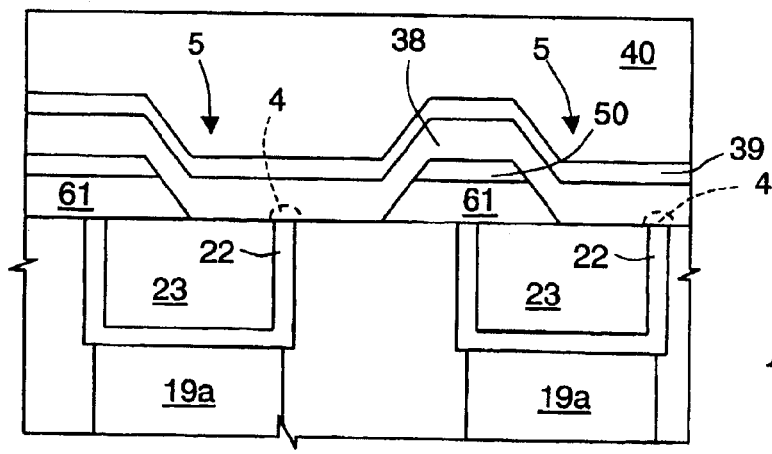
FIG. 31 is a cross-section similar to that of FIG. 29, for the embodiment of FIG. 30.

The resulting cross-section in the finished device is shown in FIG. 31. As visible, the phase change portions 4 of two adjacent cells 5 are now farer, and are separated by an insulating region 61, formed by mold layers 27, 49, stop layer 48 and spacers 55a in the first embodiment and by mold layer 27 in the second embodiment. Furthermore, the portion of the cup-shaped region 22 intermediate between two phase change portions 4 (and thus not contacted by the chalcogenic layer 38) acts as a heat sinker. Thereby, in case of programming bit1 at a temperature T1, bit 2 is heated to a temperature T2=T1/100.

The advantages of the process and structure described are illustrated hereinafter. First, it is possible to obtain just one contact area 45, 58 for each cup-shaped region 22, and thus for each cell 5; thereby the total contact area is reduced, so solving the problems highlighted above.

The elimination of the second contact can be obtained without requiring additional masking steps in the case where the thin region 38a is defined according to the first embodiment, using the minitrench technique thanks to the shape of the minitrench mask E.

With the second embodiment (i.e., using the rapier-selection mask G) the process allows instead smaller and more controllable dimensions by adding a special mask.

The rectangular or ovalized shape of the cup-shaped region 22 reduces the spread in the dimensions of the contact area 45, 58 also when its shape, instead of being rectangular as in the ideal case, is oval, as may be seen from a comparison between FIG. 26a, which shows the position of the cup-shaped region 22 with respect to thin region 38a in the absence of mask misalignment, and FIG. 26b, which shows the relative position in presence of misalignment.

Finally, it is clear that numerous modifications and variations may be made to the process and to the memory cell described and illustrated herein, all falling within the scope of the invention, as defined in the attached claims. For example, the sequence of steps required for forming the spacer region 55a and of the strip 57 may vary. In particular, for forming the opening 51 it is possible to etch the adhesion layer 50 and the mold layer 49 alone, without removing the stop layer 48. Next, the spacer region 55a is formed in the way described previously, by depositing a spacer layer and etching it anisotropically. Then, the stop layer 48 is removed only where it is not covered by the spacer region 55a, and in this way the strip 57 is uncovered. Before depositing the spacer layer 55, a nitride layer may be deposited and removed from the horizontal portions during the etch back so as to remain only under the spacer region 55a. This further nitride layer protects the adhesion layer 50 and prevents, the latter to be contaminated by the spacer layer 55, of oxide, both upwardly and on the lateral sides. It also acts as an etch stop and avoid an undesired etching of the dielectric layer 20 and the dielectric material 23 during etch back when forming the spacer region 55a.

Furthermore, in the second embodiment, a stop layer may be deposited before the mold layer, analogously to what described for the first embodiment. Finally, when an adhesion layer is not required, the process according to the second embodiment may be simplified so as to form the delimitation layers 29, 35 directly on the insulating layer 20. In this case, the delimitation layers 29, 35 form themselves a mold layer and when the sacrificial region 31a is removed, the slit 37 is directly obtained.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

We claim:

1. A contact structure in a semiconductor electronic device, comprising:
    a first conductive region having a closed-shape wall including a first thin portion having a first sublithographic dimension in a first direction; and
    a second conductive region of a phase change material which extends on top of said first conductive region;
    said second conductive region including a second thin portion having a second sublithographic dimension in a second direction transverse to said first direction, said second thin portion crossing, and being in direct electrical contact with, said first conductive region only at said first thin portion so as to form a single contact area having a sublithographic extension.

2. A phase-change memory cell comprising:
    a resistive element with a wall having a closed shape including a first thin portion having a first sublithographic dimension in a first direction; and
    a memory region made of a phase-change material, which extends on top of said resistive element;
    said memory region comprising a second thin portion having a second sublithographic dimension in a second direction transverse to said first direction, said second thin portion crossing, and being in direct electrical contact with, said first resistive element only at said first thin portion so as to form a single contact area having a sublithographic extension.

3. The memory cell according to claim 2, wherein said second thin portion is surrounded by a mold layer of a dielectric material, which forms an opening having an approximately rectangular shape.

4. The memory cell according to claim 3, wherein said second thin portion is delimited on a side by, and is in direct contact with said mold layer, and said opening has a sublithographic dimension.

5. The memory cell according to claim 3, wherein said second thin portion is surrounded by a spacer region housed in said opening, and said opening is of lithographic dimension.

6. The memory cell according to claim 5, wherein said resistive element is formed inside an insulating layer, said mold layer extends above said insulating layer, and a stop layer extends between said insulating layer and said mold layer, said spacer region being of silicon dioxide, said mold layer and said insulating layer being of a silicon glass, and said stop layer being of silicon nitride.

7. The memory cell according to claim 2, wherein said closed line is chosen between rectangular and elongated oval.

8. A memory array comprising: two memory cells, each of which has a respective resistive element including a first thin portion having a first sublithographic dimension in a first direction, said two memory cells further including a common memory region of a phase change material extending above said resistive elements and including a second thin portion having a second sublithographic dimension in a second direction transverse to said first direction;
    wherein said memory cells are adjacent to one another in said first direction;
    each resistive element crossing, and being in direct electrical contact with, said second thin region only in a point of said first thin portion so as to form a respective single contact area having a sublithographic extension.

9. The memory array according to claim 8, wherein said second thin portion has an elongated shape and extends substantially along said first direction between said two memory cells.

10. A memory array comprising:
a first memory cell having a first resistive element;
a second memory cell having a second resistive element;
a phase change material formation extending above said resistive elements;
wherein said resistive elements have a closed shape and said memory cells are adjacent to one another in a first direction;
said phase change material formation crossing each resistive element at a first point and at a second point, wherein the second point of the first resistive element is adjacent to the first point of the second resistive element;
said resistive elements having, at said second points, a first sublithographic dimension in said first direction;
said phase change material formation including a first contact portion and a second contact portion having a second sublithographic dimension in a second direction transverse to said first direction, said contact portions being in direct electrical contact with said resistive elements at said second points;
wherein insulating formations extend between said first points of said resistive elements and said phase change material formation, thereby each resistive element and said phase change material formation have a single contact area having a sublithographic extension.

11. The memory array of claim 10, wherein said second points are surrounded by a mold layer of a dielectric material, which forms respective openings having an approximately rectangular shape.

12. The memory array of claim 11, wherein said second points delimited on a side by, and is in direct contact with said mold layer, and said opening has a sublithographic dimension.

13. The memory array of claim 11, wherein each of said second points are surrounded by a spacer region housed in said opening, and said opening is of lithographic dimension.

14. The memory array of claim 13, wherein said resistive elements are formed inside an insulating layer that includes said insulating formations, said mold layer extends above said insulating layer, and a stop layer extends between said insulating layer and said mold layer, said spacer region being of silicon dioxide, said mold layer and said insulating layer being of a silicon glass, and said stop layer being of silicon nitride.

15. The memory array of claim 10, wherein said closed shape is either rectangular or elongated oval.

16. The contact structure of claim 1, wherein said second thin portion is surrounded by a mold layer of a dielectric material, which forms an opening having an approximately rectangular shape.

17. The contact structure of claim 16, wherein said second thin portion is delimited on a side by, and is in direct contact with said mold layer, and said opening has a sublithographic dimension.

18. The contact structure of claim 16, wherein said second thin portion is surrounded by a spacer region housed in said opening, and said opening is of lithographic dimension.

19. The contact structure of claim 18, wherein said first conductive region is formed inside an insulating layer, said mold layer extends above said insulating layer, and a stop layer extends between said insulating layer and said mold layer, said spacer region being of silicon dioxide, said mold layer and said insulating layer being of a silicon glass, and said stop layer being of silicon nitride.

20. The contact structure of claim 1, wherein said closed-shape wall is either rectangular or elongated oval.

* * * * *